(12) United States Patent
Kwak

(10) Patent No.: US 10,733,094 B2
(45) Date of Patent: Aug. 4, 2020

(54) MEMORY SYSTEM, CONTROLLER, METHOD OF OPERATING A CONTROLLER, AND METHOD OF OPERATING A MEMORY SYSTEM FOR PROCESSING BIG DATA BY USING COMPRESSION AND DECOMPRESSION

(71) Applicant: SK hynix Inc., Icheon-si, Gyeonggi-do (KR)

(72) Inventor: Chang-Min Kwak, Bucheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 35 days.

(21) Appl. No.: 16/008,252

(22) Filed: Jun. 14, 2018

(65) Prior Publication Data

US 2019/0138439 A1 May 9, 2019

(30) Foreign Application Priority Data

Nov. 8, 2017 (KR) .................... 10-2017-0148003

(51) Int. Cl.
*G06F 12/02* (2006.01)
*G06F 3/06* (2006.01)
*H03M 7/30* (2006.01)

(52) U.S. Cl.
CPC .......... *G06F 12/0246* (2013.01); *G06F 3/064* (2013.01); *G06F 3/0619* (2013.01); *G06F 3/0679* (2013.01); *H03M 7/3084* (2013.01); *H03M 7/3086* (2013.01); *H03M 7/6023* (2013.01)

(58) Field of Classification Search
CPC ...... G06F 3/0619; G06F 3/064; G06F 3/0679; G06F 12/0246; H03M 7/3084; H03M 7/3086; H03M 7/6023
See application file for complete search history.

(56) References Cited

U.S. PATENT DOCUMENTS

| 7,587,568 B2* | 9/2009 | Muthulingam ....... G06F 3/0608 711/165 |
| 2018/0046381 A1* | 2/2018 | Fagiano ................ G06F 3/0608 |

FOREIGN PATENT DOCUMENTS

| KR | 1020130097972 A | 9/2013 |
| KR | 101573379 B1 | 12/2015 |

* cited by examiner

*Primary Examiner* — Aracelis Ruiz
(74) *Attorney, Agent, or Firm* — William Park & Associates Ltd.

(57) ABSTRACT

In accordance with an embodiment, a controller may be provided. The controller may include a selection block configured to select cold data among write data. The controller may include a compression block configured to generate a plurality of unit data by dividing the cold data according to a predetermined size, assign each of the unit data to each of a plurality of channels, and compressing in parallel each of the unit data to generate compressed data. The controller may include an arbitration block configured to generate a plurality of packet data by packetizing each of the compressed data, and outputting the packet data.

20 Claims, 5 Drawing Sheets

MEMORY SYSTEM, CONTROLLER, METHOD OF OPERATING A CONTROLLER, AND METHOD OF OPERATING A MEMORY SYSTEM FOR PROCESSING BIG DATA BY USING COMPRESSION AND DECOMPRESSION

CROSS-REFERENCE TO RELATED APPLICATIONS

The present application claims priority under 35 U.S.C. § 119(a) to Korean Patent Application No. 10-2017-0148003 filed on Nov. 8, 2017, the disclosure of which is incorporated herein by reference in its entirety.

BACKGROUND

1. Technical Field

Various embodiments generally relate to a memory system and method of operating the memory system. Particularly, examples of embodiments may relate to a controller, and an operating method thereof.

2. Related Art

The paradigm for computing environments is shifting toward ubiquitous computing which allows users to use computer systems anytime and anywhere. For this reason, the demand for portable electronic devices, such as mobile phones, digital cameras and laptop computers are soaring. Those electronic devices generally include a memory system using a memory device as a data storage device. The data storage device may be used as a main memory unit or an auxiliary memory unit of a portable electronic device.

Since the data storage device using a memory device does not have a mechanical driving unit, it may have excellent stability and durability. Also, the data storage device has a quick data access rate with low power consumption. Non-limiting examples of the data storage device having such advantages include Universal Serial Bus (USB) memory devices, memory cards of diverse interfaces, Solid-State Drives (SSD) and the like.

SUMMARY

In accordance with an embodiment, an operating method of a controller may be provided. The method may include caching write data and map data corresponding to the write data into a memory. The method may include flushing the cached map data into the memory device. The method may include storing the write data in the memory device. The map data may include caching location information of the write data.

In accordance with an embodiment, a controller may be provided. The controller may include a selection block configured to select cold data among write data. The controller may include a compression block configured to generate a plurality of unit data by dividing the cold data according to a predetermined size, assign each of the unit data to each of a plurality of channels, and compressing in parallel each of the unit data by a compressor included in each of the channels to generate compressed data. The controller may include an arbitration block configured to generate a plurality of packet data by packetizing each of the compressed data, and outputting the packet data.

In accordance with an embodiment, a memory system may be provided. The memory system may include a memory device. The memory system may include a controller coupled to the memory device. The controller may include a selection block configured to receive a write request to store data in the memory device and select cold data from the data corresponding to the write request. The controller may include a compression block configured to generate a plurality of unit data by dividing the cold data according to a predetermined size, assign each of the unit data to each of a plurality of channels, and compressing each of the unit data assigned to a channel in parallel to generate compressed data. The controller may include an arbitration block configured to add a header to each of the compressed data to generate a plurality of packet data, generate output data including the plurality of packet data, and outputting the output data to store the packet data in the memory device.

In accordance with an embodiment, a method of operating a controller may be provided. The method may include receiving a write request for data and selecting cold data from the data corresponding to the write request. The method may include generating a plurality of unit data by dividing the cold data according to a predetermined size, assigning each of the unit data to each of a plurality of channels, and compressing in parallel each of the unit data assigned to a channel to generate compressed data. The method may include generating a plurality of packet data by packetizing each of the compressed data, and transferring the packet data to a memory device.

In accordance with an embodiment, a method of operating a controller may be provided. The method may include receiving a read request for data and selecting cold data from the data corresponding to the read request. The method may include reading compressed data included in the cold data from a memory device based on first address information and second address information. The method may include assigning the compressed data to each of a plurality of channels based on header information and depacketizing the assigned data to remove header information from compressed data. The method may include performing a decompression operation on the compressed data. The first address information may be a storage start address of the memory device indicating a location where the compressed data for the cold data that has been stored in the memory device begins, and the second address information may be a storage end address of the memory device indicating a location where the compressed data for the cold data that has been stored in the memory device ends.

In accordance with an embodiment, the selection block may be configured to select hot data from among the write data and output the hot data by bypassing the compression block and arbitration block to store the hot data.

DETAILED DESCRIPTION

Figure 1:
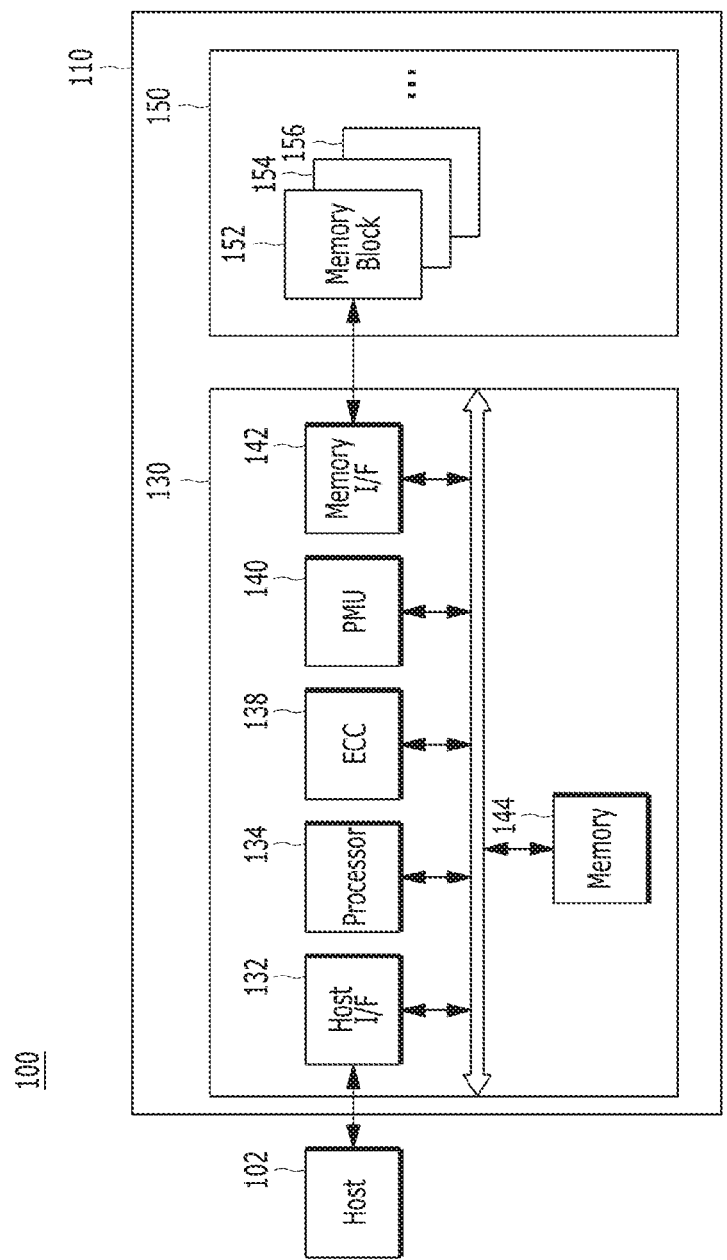
FIG. 1 is a block diagram illustrating a data processing system including a memory system, in accordance with an embodiment.

Various embodiments are described below with reference to the accompanying drawings. We note, however, that the examples may be embodied in different other embodiments, forms and variations thereof and should not be construed as being limited to the embodiments set forth herein. Rather, the described embodiments are provided so that this disclosure will be thorough and complete, and will fully convey the concepts to those skilled in the art. Throughout the disclosure, like reference numerals refer to like parts throughout the various figures and embodiments.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present disclosure.

The drawings are not necessarily to scale and, in some instances, proportions may have been exaggerated in order to clearly illustrate features of the embodiments. When an element is referred to as being connected or coupled to another element, it should be understood that the former can be directly connected or coupled to the latter, or electrically connected or coupled to the latter via an intervening element therebetween.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting.

As used herein, singular forms are intended to include the plural forms as well, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present disclosure. The concepts may be practiced without some or all of these specific details. In other instances, well-known process structures and/or processes have not been described in detail in order not to unnecessarily obscure the present disclosure.

It is also noted, that in some instances, as would be apparent to those skilled in the relevant art, a feature or element described in connection with one embodiment may be used singly or in combination with other features or elements of another embodiment, unless otherwise specifically indicated.

Various embodiments may be directed to a controller capable of efficiently storing big data using compression and decompression, and an operating method thereof.

FIG. 1 is a block diagram illustrating a data processing system 100 in accordance with an embodiment.

Referring to FIG. 1, the data processing system 100 may include a host 102 operatively coupled to a memory system 110.

The host 102 may include, for example, a portable electronic device such as a mobile phone, an MP3 player and a laptop computer or an electronic device such as a desktop computer, a game player, a TV, a projector and the like.

The memory system 110 may operate in response to a request from the host 102, and in particular, store data to be accessed by the host 102. The memory system 110 may be used as a main memory system or an auxiliary memory system of the host 102. The memory system 110 may be implemented with any one of various types of storage devices, which may be electrically coupled with the host 102, according to a protocol of a host interface. Examples of suitable storage devices include a solid state drive (SSD), a multimedia card (MMC), an embedded MMC (eMMC), a reduced size MMC (RS-MMC) and a micro-MMC, a secure digital (SD) card, a mini-SD and a micro-SD, a universal serial bus (USB) storage device, a universal flash storage (UFS) device, a compact flash (CF) card, a smart media (SM) card, a memory stick, and the like.

The storage devices for the memory system 110 may be implemented with a volatile memory device such as a dynamic random access memory (DRAM) and a static RAM (SRAM) and nonvolatile memory device such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), resistive RAM (RRAM) and a flash memory.

The memory system 110 may include a memory device 150 which stores data to be accessed by the host 102, and a controller 130 which may control storage of data in the memory device 150.

The controller 130 and the memory device 150 may be integrated into a single semiconductor device, which may be included in the various types of memory systems as exemplified above.

The memory system 110 may be configured as part of a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation system, a black box, a digital camera, a digital multimedia broadcasting (DMB) player, a 3D television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, a radio frequency identification (RFID) device, or one of various component elements configuring a computing system.

The memory device 150 may be a nonvolatile memory device and may retain data stored therein even though power is not supplied. The memory device 150 may store data provided from the host 102 through a write operation, and provide data stored therein to the host 102 through a read operation. The memory device 150 may include a plurality of memory blocks 152 to 156, each of the memory blocks 152 to 156 may include a plurality of pages. Each of the pages may include a plurality of memory cells to which a plurality of word lines (WL) are electrically coupled.

The controller 130 may control overall operations of the memory device 150, such as read, write, program and erase operations. For example, the controller 130 of the memory system 110 may control the memory device 150 in response to a request from the host 102. The controller 130 may provide the data read from the memory device 150, to the host 102, and/or may store the data provided from the host 102 into the memory device 150.

The controller 130 may include a host interface (I/F) unit 132, a processor 134, an error correction code (ECC) unit 138, a power management unit (PMU) 140, a memory device controller such as a memory interface (I/F) unit 142 and a memory 144 all operatively coupled via an internal bus.

The host interface unit 132 may process commands and data provided from the host 102, and may communicate with the host 102 through at least one of various interface protocols such as universal serial bus (USB), multimedia card (MMC), peripheral component interconnect-express (PCI-E), small computer system interface (SCSI), serial-attached SCSI (SAS), serial advanced technology attachment (SATA), parallel advanced technology attachment (PATA), small computer system interface (SCSI), enhanced small disk interface (ESDI) and integrated drive electronics (IDE), etc.

The ECC unit 138 may detect and correct errors in the data read from the memory device 150 during the read operation. The ECC unit 138 may not correct error bits when the number of the error bits is greater than or equal to a threshold number of correctable error bits, and may output an error correction fail signal indicating failure in correcting the error bits.

The ECC unit 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and so on. The ECC unit 138 may include all circuits, modules, systems or devices for the error correction operation.

The PMU 140 may provide and manage power of the controller 130.

The memory interface 142 may serve as a memory/storage interface between the controller 130 and the memory device 150 to allow the controller 130 to control the memory device 150 in response to a request from the host 102. The memory interface 142 may generate a control signal for the memory device 150 and process data to be provided to the memory device 150 under the control of the processor 134 when the memory device 150 is a flash memory and, in particular, when the memory device 150 is a NAND flash memory.

The memory 144 may serve as a working memory of the memory system 110 and the controller 130, and store data for driving the memory system 110 and the controller 130. The controller 130 may control the memory device 150 in response to a request from the host 102. The controller 130 may provide data read from the memory device 150 to the host 102, may store data provided from the host 102 into the memory device 150. The memory 144 may store data required for the controller 130 and the memory device 150 to perform these operations.

The memory 144 may be implemented with a volatile memory. The memory 144 may be implemented with a static random access memory (SRAM) or a dynamic random access memory (DRAM). Although FIG. 1 exemplifies the memory 144 disposed within the controller 130, the present disclosure is not limited thereto. That is, the memory 144 may be disposed within or out of the controller 130. For instance, in an embodiment, the memory 144 may be embodied by an external volatile memory having a memory interface transferring data between the memory 144 and the controller 130.

The processor 134 may control the overall operations of the memory system 110. The processor 134 may drive firmware to control the overall operations of the memory system 110. The firmware may be referred to as flash translation layer (FTL).

A FTL may perform an operation as an interface between the host 102 and the memory device 150. The host 102 may request the memory device 150 to perform write and read operations through the FTL.

The FTL may manage operations of address mapping, garbage collection, wear-leveling and so forth. Particularly, the FTL may store map data. Therefore, the controller 130 may map a logical address, which is provided from the host 102, to a physical address of the memory device 150 through the map data. The memory device 150 may perform an operation like a general device because of the address mapping operation. Also, through the address mapping operation based on the map data, when the controller 130 updates data of a particular page, the controller 130 may program new data into another empty page and may invalidate old data of the particular page due to a characteristic of a flash memory device. Further, the controller 130 may store map data of the new data into the FTL.

The processor 134 may be implemented with a microprocessor or a central processing unit (CPU). The memory system 110 may include one or more processors 134.

A management unit (not illustrated) may be included in the processor 134, and may perform bad block management of the memory device 150. The management unit may find bad memory blocks included in the memory device 150, which are in unsatisfactory condition for further use, and perform bad block management on the bad memory blocks. When the memory device 150 is a flash memory, for example, a NAND flash memory, a program failure may occur during the write operation, for example, during the program operation, due to characteristics of a NAND logic function. During the bad block management, the data of the program-failed memory block or the bad memory block may be programmed into a new memory block. Also, the bad blocks seriously deteriorate the utilization efficiency of the memory device 150 having a 3D stack structure and the reliability of the memory system 100, and thus reliable bad block management is required.

Large-capacity information and data may be produced. Accordingly, a system capable of efficiently storing the large-capacity information and data is used for some embodiments. For example, a Hadoop system may be implemented. For instance, the Hadoop system may correspond to the data processing system 100 illustrated in FIG. 1. The Hadoop system may include a client corresponding to the host 102, a name node corresponding to the controller 130, and a data node which is a storage area corresponding to the memory device 150. The Hadoop system may efficiently store a great deal of data and perform logical operations onto the stored data. In addition, the Hadoop system, which is a distributed system configured of a distributed file system, may execute programming in parallel in a device cluster. For the sake of convenience in description, an embodiment, will be described below on a basis of the data processing system 100 illustrated in FIG. 1.

An embodiment may be directed to a controller capable of efficiently storing large-capacity information and data and reloading them. Specifically, a method of compressing and decompressing the large-capacity information and data is provided.

Figure 2:
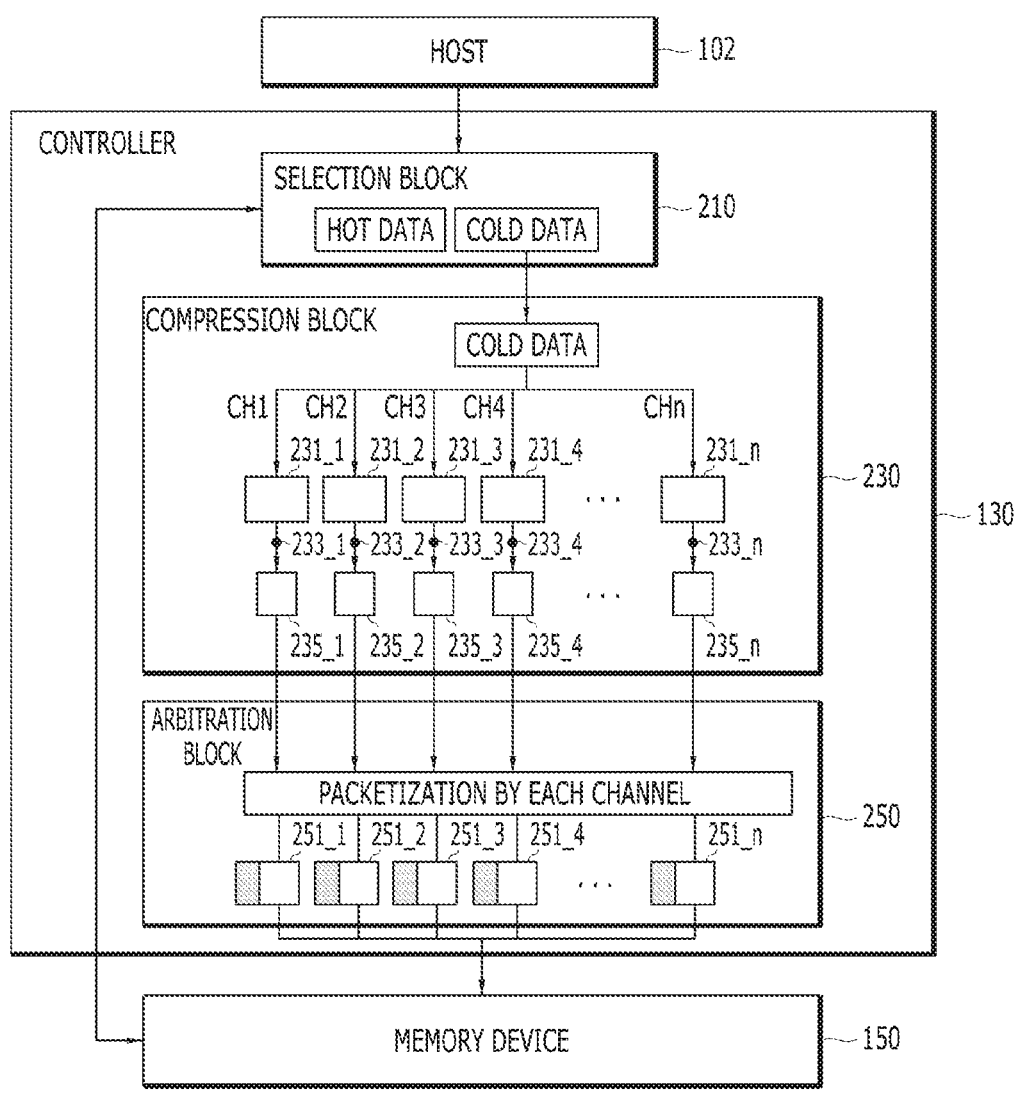
FIG. 2 is a block diagram illustrating a memory system including a controller in accordance with an embodiment.

FIG. 2 is a block diagram illustrating the controller 130 in accordance with an embodiment.

The controller 130 described above with reference to FIG. 1 may further include a selection block 210, a compression block 230, and an arbitration block 250. The selection block 210 and the arbitration block 250 may be included in the processor 134 described above with reference to FIG. 1, or may be included in the controller 130, separately from the processor 134. In an embodiment, the selection block 210 may be implemented with software, hardware, or any combination thereof. In an embodiment, the compression block 230 may be implemented with software, hardware, or any combination thereof. In an embodiment, the arbitration block 250 may be implemented with software, hardware, or any combination thereof.

The selection block 210 may receive a request generated from a host 102 described above with reference to FIG. 1. The selection 210 may divide data corresponding to the request into cold data and hot data. The cold data is data in which an access request for the data by the host 102 is smaller than a threshold value, and the hot data is data in which the access request for the data by the host 102 is equal to or greater than the threshold value. When the data corresponding to the request of the host 102 is the hot data, there is no need to compress the data for an easy access because an access to the data is equal to or greater than the threshold value. For example, the access request may include read request or write request. And, with regards to access request, is access request per unit time or is this a value (i.e., number of times accessed.) The threshold value may be set by the designer. When the data corresponding to the request of the host 102 is the cold data, there is a need to compress the data in order to efficiently secure a storage area of the memory device 150 because an access to the data is smaller than the threshold value. In other words, the selection block 210 may select the cold data to be compressed. However, a criterion for dividing into the cold data and the hot data is merely an example, and the present disclosure is not limited thereto.

The selection block 210 may store address information of the data corresponding to the request of the host 102. Specifically, the selection block 210 may store a storage start address and a storage end address when compressed data 235_1 to 235_n, which is to be described below, is stored in the memory device 150, a storage end address of last data when the compressed data 235_1 to 235_n or the hot data is stored in the memory device 150, and information on a size of the data.

When the data corresponding to the request of the host 102 is the hot data, the selection block 210 may directly store the hot data in the memory device 150 without going through the compression block 230 and the arbitration block 250, which are to be described below. At this time, the selection block 210 may store the hot data based on the storage end address of the last data stored in the memory device 150.

The compression block 230 may receive the cold data to be compressed from the selection block 210. The compression block 230 may divide the cold data according to a predetermined size of the data. The compression block 230 may generate a plurality of unit data 231_1 to 231_n divided with the predetermined size, and assign each of the generated unit data 231_1 to 231_n to each of a plurality of channels. For example, when the cold data having a size of 64 bytes is a target to be compressed, and it is assumed that a size of the unit data 231_1 to 231_n is 1 byte, the compression block 230 may divide the cold data into total 64 unit data 231_1 to 231_n by 1 byte, and assign each of the unit data 231_1 to 231_n to each of 64 channels. Subsequently, the compression block 230 may compress in parallel each of the unit data 231_1 to 231_n assigned to each of the channels. For example, a plurality of compressors 233_1 to 233_n may be included in each of the channels. The compressors 233_1 to 233_n of the compression block 230 may compress data using a Lempel-Ziv-Welch (LZW) scheme. For example, the LZW scheme is to basically compress data by generating patterns from the data without using statistical properties of the data. The patterns of the data may be organized into a table while reading the data sequentially. For example, when a character string of "aabbbbbeee" is cut in 2 units, the character string may be divided into "aa", "bb", "bb", "be", and "ee". "aa" may be first registered in the table, and subsequently "bb", "bb", "be", and "ee" may be registered in the table. A first "bb" may be registered in a B pattern in the table, and subsequently, a second "bb" may be registered in a C pattern based on the table. The compressors 233_1 to 233_n using the LZW scheme may compress data based on registered patterns. In other words, the LZW scheme is to register data patterns according to conditions based on inputted data and compress data based on the registered data patterns. As described above, the LZW scheme has advantages in that the rate of the compression may be fast, and the efficiency of the compression may increase as the capacity of data increases.

The compression block 230 may perform a decompression operation onto compressed data 235_1 to 235_n by the request of the host 102. Besides, the compression block 230 may collect decompressed data, and align and combine the collected decompressed data in an original data order. For example, the compression block 230 may collect decompressed data from each of the 1-byte channels, and align and combine the collected decompressed data in the original data order to restore the decompressed data back to original data.

The arbitration block 250 may perform a packetization of adding header information to the compressed data 235_1 to 235_n outputted from each of the channels. The header information may include information on a corresponding channel. Subsequently, the arbitration block 250 may output packet data 251_1 to 251_n from each of the channels. When there is not packet data of a specific channel, packet data of a next channel may be outputted. In addition, the arbitration block 250 may store the output data in the memory device 150. For example, the arbitration block 250 may receive the storage start address of the memory device 150 in which the output data is stored from the selection block 210. Accordingly, the arbitration block 250 may store the output data in the memory device 150 based on the storage start address. Also, the arbitration block 250 may transfer a last address of the memory device 150 to the selection block 210.

While the data is decompressed, the arbitration block 250 may perform the decompression operation based on the storage start address and storage end address of the data to be processed, which is transferred from the selection block 210. The arbitration block 250 may assign the data, which is a target for the decompression operation, to each of the channels based on the header information. Subsequently, the arbitration block 250 may perform the decompression operation up to and on the storage end address, and notify the selection block 210 that the decompression operation is completed. The selection block 210 may check whether or not the decompression operation is completed based on size information of the data.

Figure 3:
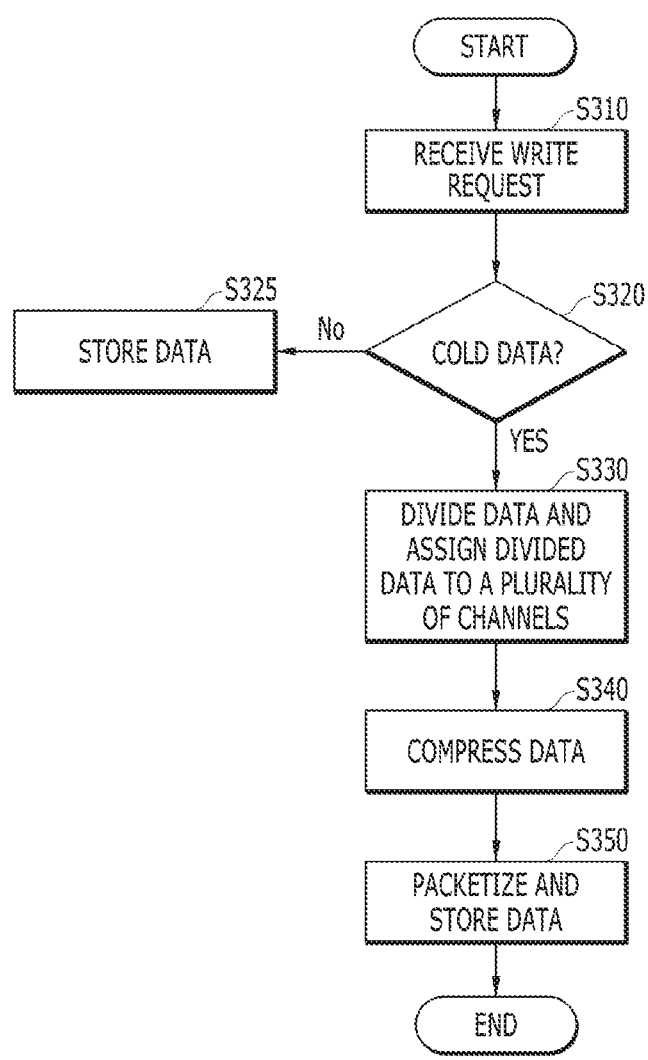
FIG. 3 is a flowchart illustrating an operation of a controller in accordance with an embodiment.

FIG. 3 is a flowchart illustrating an operation of the controller 130 in accordance with an embodiment. For example, the operation of the controller 130 that receives a write request from the host 102, and compresses and stores the cold data corresponding to the write request are illustrated in FIG. 3.

In step S310, the selection block 210 may receive the write request generated from the host 102. The selection block 210 may receive size information of data corresponding to the write request and the address information described above.

In step S320, as described above with reference to FIG. 2, the selection block 210 may determine whether or not the data corresponding to the write request is the cold data. In other words, the selection block 210 may determine whether or not the data corresponding to the write request is a target for the compression operation.

When the data corresponding to the write request is the hot data (that is, "NO" in step S320), the selection block 210 may directly store the data in the memory device 150 based on the address information in step S325.

When the data corresponding to the write request is the cold data (that is, "YES" in step S320), as described above, the compression block 230 may generate the unit data 231_1 to 231_n by dividing the cold data according to the predetermined size, and assign the generated unit data 231_1 to 231_n to each of the channels in step S330.

In step S340, the compression block 230 may compress in parallel the data assigned to each of the channels. The compression block 230 may compress the data in the LZW scheme.

In step S350, the arbitration block 250 may perform the packet operation of adding the header information to the compressed data 235_1 to 235_n outputted from each of the channels. In other words, the arbitration block 250 may output each of the packet data 251_1 to 251_n from each of the channels. Subsequently, the arbitration block 250 may store the output data in the memory device 150. For example, the arbitration block 250 may receive the storage start address of the memory device 150 in which the output data is stored from the selection block 210. The arbitration block 250 may store the output data in the memory device 150 based on the storage start address. Also the arbitration block 250 may transfer the storage end address of the memory device 150 in which the data is stored to the selection block 210. In an embodiment, the arbitration block 250 may perform the packet operation of adding the header information to the compressed data 235_1 to 235_n from each of the channels in parallel. In an embodiment, the arbitration block 250 may packetize or may perform packetizing to add the header information to the compressed data 235_1 to 235_n outputted from each of the channels.

Figure 4:
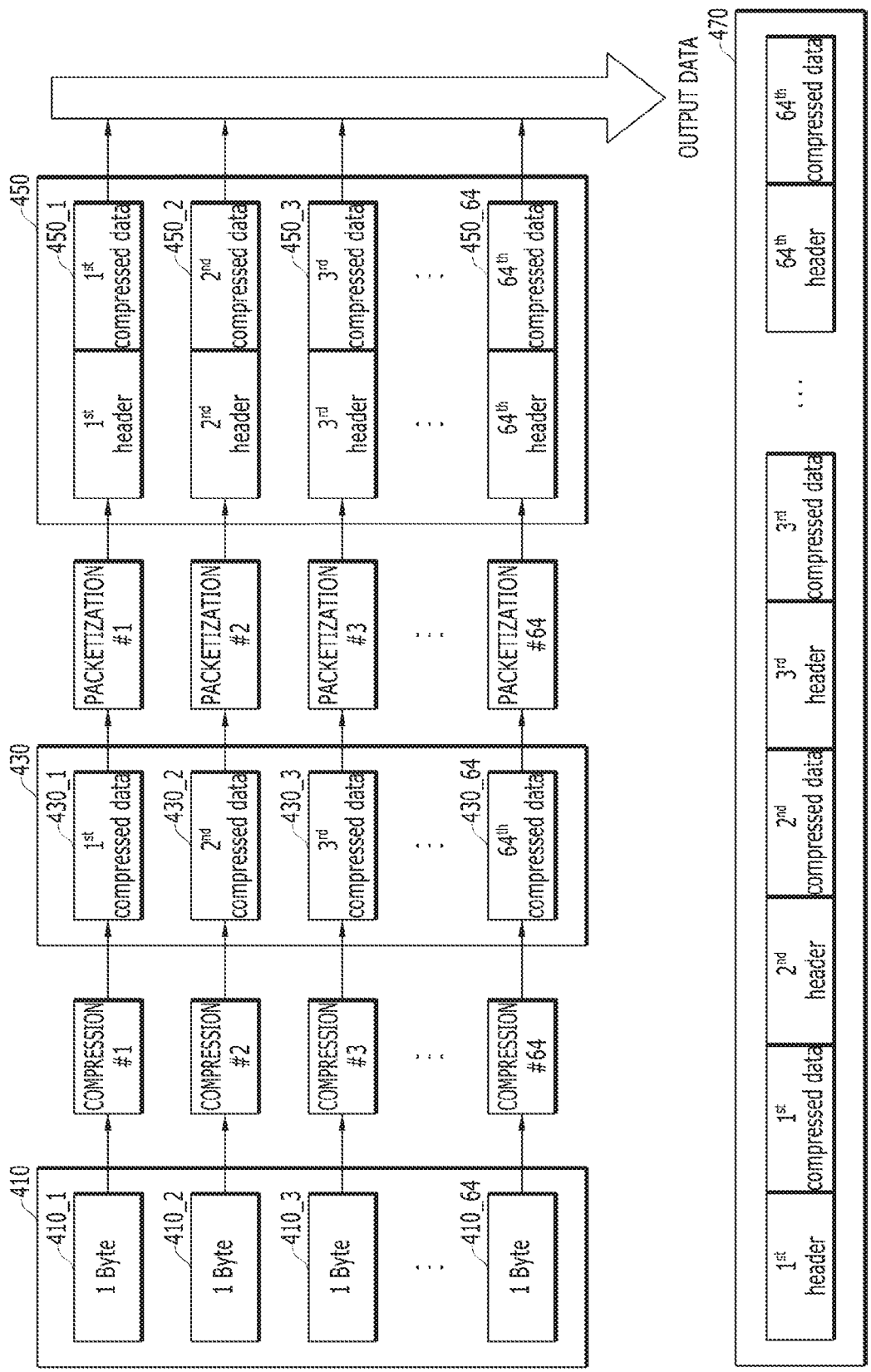
FIG. 4 is a block diagram illustrating a compression operation in accordance with an embodiment.

FIG. 4 is a block diagram illustrating output data 470 in accordance with an embodiment. Hereinafter, it is assumed that the controller 130 receives 64-byte data, divides the data into 64 channels by 1 byte, and compresses the divided data. As described above, the selection block 210 may receive the write request generated from the host 102, and determine whether or not the data corresponding to the write request is the cold data.

When the data corresponding to the write request is the cold data, the compression block 230 may divide the data into unit data according to the predetermined size. For example, input data 410 having a size of 64 bytes may be divided into unit data having a size of 1 byte, and the divided unit data may be assigned to 64 channels 410_1 to 410_64 respectively. The compression block 230 may perform the compression operation in parallel onto the data assigned to each of the channels 410_1 to 410_64 respectively. The compression block 230 may compress the input data 410 in the LZW scheme.

Subsequently, the arbitration block 250 may perform the packet operation onto compressed data 430. Specifically, the arbitration block 250 may perform the packet operation in parallel onto each of channels 430_1 to 430_64 of the compressed data 430. Packet data 450 may be outputted from each of channels 450_1 to 450_64.

Specifically, first header information and data compressed in a first channel 450_1 may be outputted as a first packet data. Second header information and data compressed in a second channel 450_2 may be outputted as a second packet data, and subsequently third header information and data compressed in a third channel 450_3 may be outputted as a third packet data. In the same manner, $64^{th}$ header information and data compressed in a $64^{th}$ channel 450_64 may be outputted as a $64^{th}$ packet data.

Figure 5:
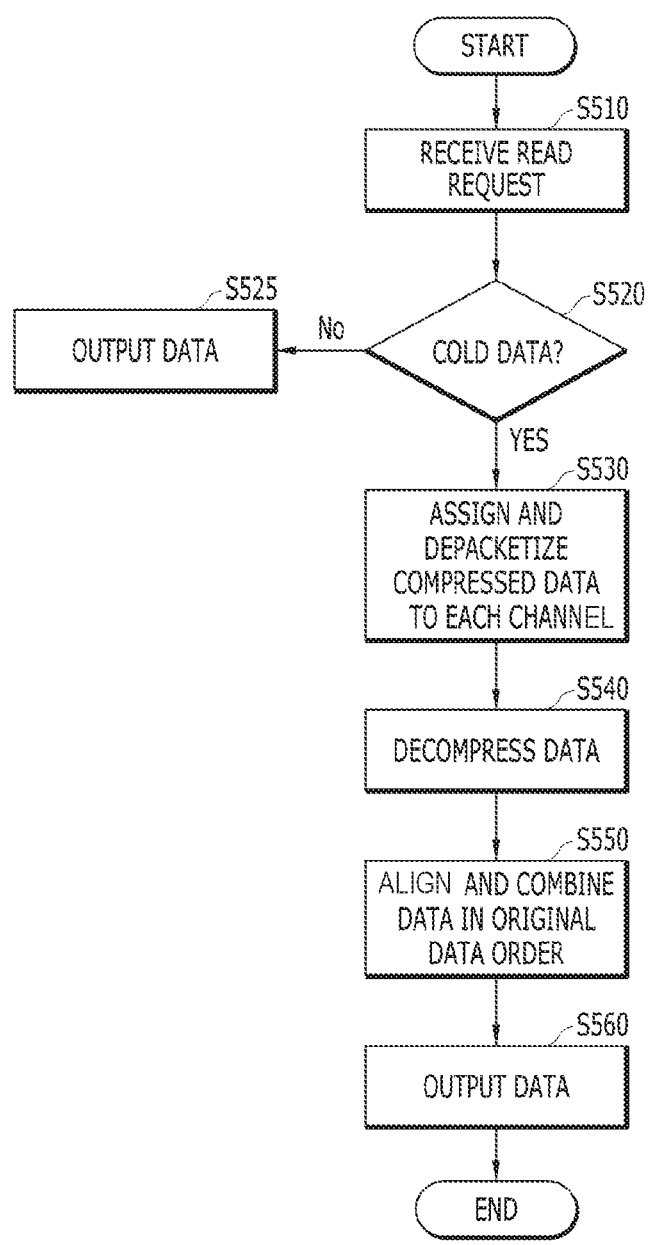
FIG. 5 is a flowchart illustrating an operation of a controller in accordance with an embodiment.

FIG. 5 is a flowchart illustrating an operation of the controller 130 in accordance with an embodiment. Specifically, the operation of the controller 130 that receives a read request from the host 102, decompresses the cold data corresponding the read request, and outputs recovered data to an external device is illustrated in FIG. 5. For the sake of convenience in description, it is assumed that the data corresponding to the read request is the cold data.

In step S510, the selection block 210 may receive the read request from the host 102. With the read request, the selection block 210 may receive size information of the data corresponding to the read request and address information to be originally stored. In an embodiment, the selection block 210 may receive size information of the data corresponding to the read request and simultaneously receive address information to be originally stored.

In step S520, the selection block 210 may determine whether or not the data corresponding to the read request is the cold data.

When the data corresponding to the read request is the hot data (that is, "NO" in step S520), the selection block 210 may directly read and output the data from the memory device 150 based on the address information described above, in step S525.

When the data corresponding to the read request is the cold data (that is, "YES" in step S520), as described above, the arbitration block 530 may read compressed and stored data based on the address information transferred from the selection block 210, and assign the data to each of the channels based on header information, in step S530. In addition, the arbitration block 250 may perform a depacket operation in parallel onto packet data assigned to each of the channels. In an embodiment, the arbitration block 250 may depacketize or may perform depacketizing of the packet data to distinguish the header from the compressed data. In an embodiment, the arbitration block 250 may depacketize or may perform depacketizing of the packet data to remove the header from the compressed data to provide compressed data without a corresponding header.

In step S540, the compression block 230 may perform the decompression operation onto depacketized data included in each of the channels. In an embodiment, the compression block 230 my perform the decompression operation on the depacketized data included in each of the channels in parallel.

In step S550, the compression block 230 may align and combine the decompressed data in an original data order.

In step S560, the selection block 210 may receive the aligned and combined data from the compression block 230, and output the data as original data to the host 102. Specifically, when the arbitration block 250 performs the depacket operation up to and on a last address in which the data corresponding to the read request is stored, the arbitration block 250 may notify completion of the operation to the selection block 210, and the selection block 210 may output the original data to the host 102 after checking whether or not the operation is completed based on the size information of the data. Consequently, the decompression operation is completed.

The controller 130 according to an embodiment may perform the compression operation or the decompression operation according to a predetermined criterion in order to process input data in real time. Through the device and method described above with reference to FIGS. 2 to 5, it may be possible to efficiently store large-capacity data, and simultaneously, to decompress the stored compressed data to be efficiently loaded.

In one embodiment, a controller may be provided. The controller may include a memory configured for caching write data and map data corresponding to the write data. The controller may include a processor configured for flushing the cached map data into a memory device, and then storing the write data into the memory device. The map data may include location information of the write data.

In another embodiment, an operating method of a controller may be provided. The method may include caching write data and map data corresponding to the write data into a memory. The method may include flushing the cached map data into the memory device. The method may include storing the write data in the memory device. The map data may include caching location information of the write data.

In another embodiment, a controller may include a memory configured to caching write data and map data corresponding to the write data. The controller may include a processor configured to flushing the cached map data into a memory device, and then storing the write data into the memory device. The map data may include location information of the write data.

While the present disclosure has been described with respect to specific embodiments, it will be apparent to those skilled in the art that various changes and modifications may be made without departing from the spirit and scope of the disclosure as determined in the following claims.

What is claimed is:

1. A controller, comprising:
   a selection block configured to select cold data among write data;
   a compression block configured to generate a plurality of unit data by dividing the cold data according to a predetermined size, assign each of the unit data to each of a plurality of channels, and compress in parallel each of the unit data included in each of the channels to generate compressed data; and
   an arbitration block configured to generate a plurality of packet data by packetizing each of the compressed data, and outputting the packet data.

2. The controller of claim 1,
   wherein compressing in parallel each of the unit data included in each of the channels to generate compressed data is performed by a compressor in each of the channels, and
   wherein the compressor of the compression block compresses the unit data using a Lempel-Ziv-Welch (LZW) scheme.

3. The controller of claim 1,
   wherein the arbitration block packetizes the compressed data by adding header information to each of the compressed data and packetizes the compressed data assigned to each channel in parallel, and
   wherein the header information includes information on an assigned channel corresponding to a unit data that has been compressed for the assigned channel.

4. The controller of claim 3,
   wherein the arbitration block outputs each of the packet data from each of the channels, and then transfers each of the packet data based on first address information, and
   wherein the first address information includes a storage start address indicating a location where each of the packet data is to begin being stored.

5. The controller of claim 4,
   wherein the selection block is configured to receive a read request for data and select cold data from the data corresponding to the read request,
   wherein the arbitration block receives the cold data including packet data externally from the controller based on the first address information and second address information, assigns the packet data with a channel based on the header information for each of the compressed data, respectively, and depacketizes the packet data assigned to the channels in parallel,
   wherein the compression block performs a decompression operation on the compressed data assigned to each of the channels in parallel, and
   wherein the second address information includes a storage end address indicating a last address in which the data corresponding to the read request is stored.

6. The controller of claim 5, wherein the selection block checks completion of the decompression operation based on size information of the data.

7. The controller of claim 1,
   wherein the selection block is configured to receive a write request for data,
   wherein, when data corresponding to the write request is determined by the selection block to be hot data, the selection block outputs the hot data to store the hot data based on third address information included in the write request, and wherein the third address information includes a storage end address indicating an address location on data that was last stored.

8. A method of operating a controller, the method comprising:
receiving a write request for data and selecting cold data from the data corresponding to the write request;
generating a plurality of unit data by dividing the cold data according to a predetermined size, assigning each of the unit data to each of a plurality of channels, and compressing in parallel each of the unit data assigned to a channel to generate compressed data; and
generating a plurality of packet data by packetizing each of the compressed data, and transferring the packet data to a memory device.

9. The method of claim 8, wherein the unit data is compressed using a Lempel-Ziv-Welch (LZW) scheme.

10. The method of claim 8,
wherein packetizing each of the compressed data includes adding header information to each of the compressed data,
wherein each of the compressed data assigned to a channel is packetized in parallel, and
the header information includes information on an assigned channel corresponding to a unit data that has been compressed for the assigned channel.

11. The method of claim 10,
wherein each of the packet data from each of the channels is output and then each of the packet data is transferred to the memory device based on first address information, and
wherein the first address information includes a storage start address indicating a location where each of the packet data is to begin being stored within the memory device.

12. A method of operating a controller, the method comprising:
receiving a read request for data and selecting cold data from the data corresponding to the read request;
reading compressed data included in the cold data from a memory device based on first address information and second address information;
assigning the compressed data to each of a plurality of channels based on header information and depacketizing the assigned data to remove header information from compressed data; and
performing a decompression operation on the compressed data,
wherein the first address information is a storage start address of the memory device indicating a location where the compressed data for the cold data that has been stored in the memory device begins, and the second address information is a storage end address of the memory device indicating a location where the compressed data for the cold data that has been stored in the memory device ends.

13. The method of claim 12, further comprising:
collecting decompressed data and restoring the decompressed data to original data.

14. The method of claim 13, further comprising:
verifying the completion of the decompression operation based on size information of the data.

15. A memory system, comprising:
a memory device;
a controller coupled to the memory device, the controller comprising:
a selection block configured to receive a write request to store data in the memory device and select cold data from the data corresponding to the write request;
a compression block configured to generate a plurality of unit data by dividing the cold data according to a predetermined size, assign each of the unit data to each of a plurality of channels, and compressing each of the unit data assigned to a channel in parallel to generate compressed data; and
an arbitration block configured to add a header to each of the compressed data to generate a plurality of packet data, generate output data including the plurality of packet data, and outputting the output data to store the packet data in the memory device.

16. The memory system of claim 15, wherein the compression block compresses the unit data using a Lempel-Ziv-Welch (LZW) scheme.

17. The memory system of claim 15,
wherein the arbitration block packetizes the compressed data assigned to each channel in parallel by adding header information to each of the compressed data, and
wherein the header information includes information on an assigned channel corresponding to a unit data that has been compressed for the assigned channel.

18. The memory system of claim 17,
wherein the arbitration block outputs each of the packet data from each of the channels, and then transfers each of the packet data to the memory device based on first address information, and
wherein the first address information includes a storage start address of the memory device indicating a location where each of the packet data is to begin being stored in the memory device.

19. The memory system of claim 18,
wherein the selection block is configured to receive a read request for data and select cold data from the data corresponding to the read request,
wherein the arbitration block receives the cold data including packet data from the memory device based on the first address information and second address information, assigns the packet data with a channel based on the header information for each of the compressed data, respectively, and depacketizes the packet data assigned to the channels in parallel,
wherein the compression block performs a decompression operation on the compressed data assigned to each of the channels in parallel, and
wherein the second address information includes a storage end address indicating a last address in which the data corresponding to the read request is stored in the memory device.

20. The memory system of claim 15,
wherein the selection block is configured to receive a write request for data,
wherein, when data corresponding to the write request is determined by the selection block to be hot data, the selection block outputs the hot data to store the hot data in the memory device based on third address information included in the write request, and
wherein the third address information includes a storage end address indicating an address location on data that was last stored in the memory device.

* * * * *